US009606169B2

(12) United States Patent
Choi et al.

(10) Patent No.: US 9,606,169 B2
(45) Date of Patent: Mar. 28, 2017

(54) PROTECTION APPARATUS AND METHOD OF VERIFYING OPERATION THEREOF

(71) Applicant: LSIS CO., LTD., Anyang-si, Gyeonggi-do (KR)

(72) Inventors: Ho Seok Choi, Anyang-si (KR); Yong Kil Choi, Gunpo-si (KR)

(73) Assignee: LSIS CO., LTD., Anyang-si (KR)

( * ) Notice: Subject to any disclaimer, the term of this patent is extended or adjusted under 35 U.S.C. 154(b) by 157 days.

(21) Appl. No.: 14/312,355

(22) Filed: Jun. 23, 2014

(65) Prior Publication Data
US 2015/0008935 A1 Jan. 8, 2015

(30) Foreign Application Priority Data

Jul. 3, 2013 (KR) .................. 10-2013-0077655

(51) Int. Cl.
| | |
|---|---|
| *G01R 31/28* | (2006.01) |
| *G01R 31/327* | (2006.01) |
| *H02H 3/04* | (2006.01) |
| *H02H 7/125* | (2006.01) |
| *H02H 7/12* | (2006.01) |

(52) U.S. Cl.
CPC ..... *G01R 31/2827* (2013.01); *G01R 31/3271* (2013.01); *H02H 3/044* (2013.01); *H02H 7/125* (2013.01); *H02H 7/1213* (2013.01)

(58) Field of Classification Search
CPC ...... G01R 31/28; G01R 31/3271; H02H 3/00; H02H 7/125; H02H 3/044; H02H 7/1213
USPC ...................................................... 324/537
See application file for complete search history.

(56) References Cited

U.S. PATENT DOCUMENTS

| | | | | |
|---|---|---|---|---|
| 5,206,583 | A | * | 4/1993 | Dawson ............... G11C 29/789 324/73.1 |
| 6,359,422 | B1 | | 3/2002 | Lewis |
| 2007/0063797 | A1 | | 3/2007 | Houbre et al. |
| 2009/0088988 | A1 | * | 4/2009 | Muthu-Mannivannan G01R 31/1227 702/58 |

(Continued)

FOREIGN PATENT DOCUMENTS

| | | |
|---|---|---|
| CN | 2204073 | 7/1995 |
| CN | 1267401 | 9/2000 |

(Continued)

OTHER PUBLICATIONS

European Patent Office Application Serial No. 14174011.8, Search Report dated Nov. 20, 2014, 7 pages.

(Continued)

*Primary Examiner* — Son Le
*Assistant Examiner* — Zannatul Ferdous
(74) *Attorney, Agent, or Firm* — Lee, Hong, Degerman, Kang & Waimey

(57) ABSTRACT

A method of verifying a protection apparatus is provided. The method includes: setting a plurality of relay elements for sensing an abnormal state of the protection apparatus; receiving an input regarding test information for testing each of the plurality of relay elements; and when at least one of the plurality of relay elements is in an abnormal state from the reception of the input regarding the test information, identifying whether the protection apparatus has created an abnormal state sensing signal.

8 Claims, 8 Drawing Sheets

(56) References Cited

U.S. PATENT DOCUMENTS

| | | | |
|---|---|---|---|
| 2010/0241902 A1* | 9/2010 | Gilbertson | G01R 31/3274 714/33 |
| 2011/0026183 A1* | 2/2011 | Wu | H01T 2/02 361/115 |
| 2012/0019962 A1 | 1/2012 | Faxvog et al. | |

FOREIGN PATENT DOCUMENTS

| | | |
|---|---|---|
| CN | 2870251 | 2/2007 |
| EP | 0780951 | 6/1997 |
| EP | 2432112 | 3/2012 |
| JP | 1-286721 | 11/1989 |
| JP | H11252775 A | 9/1999 |
| KR | 20090009059 A | 1/2009 |
| KR | 20110098472 A | 9/2011 |

OTHER PUBLICATIONS

Japan Patent Office Application Serial No. 2014-137794, Office Action dated Jan. 5, 2016, 6 pages.
Korean Intellectual Property Office Application Serial No. 10-2013-0077655, Office Action dated Jul. 5, 2016, 6 pages.
State Intellectual Property Office of the People's Republic of China Application Serial No. 201410315943.3, Office Action dated Aug. 1, 2016, 9 pages.

* cited by examiner

PROTECTION APPARATUS AND METHOD OF VERIFYING OPERATION THEREOF

CROSS-REFERENCE TO RELATED APPLICATIONS

Pursuant to 35 U.S.C. §119(a), this application claims the benefit of earlier filing date and right of priority to Korean Patent Application No. 10-2013-0077655, filed on Jul. 3, 2013, which is hereby incorporated by reference in its entirety into this application.

BACKGROUND

The present disclosure relates to a protection apparatus and a method of verifying an operation thereof, and more particularly, to a method of verifying an operation of a protection apparatus for an AC filter or converter transformer used in a high voltage direct current (HVDC) system.

A high voltage direct current (HVDC) system is used for long-distance transmission and transmission of electric power using underwater power cables. Since the HVDC system generates reactive power and harmonic waves while converting electric power using a converter, it needs an AC filter.

To optimize operations of the AC filter that may be damaged by various factors and protect the AC filter, a protection apparatus including a specific relay and a protection panel is implemented.

Particularly, the relay is a device to open or close an electric circuit depending on various input signals, such as temperature, light, and the like as well as electric signals, such as voltage, current, power, frequency, and the like, and has various purposes as well as a general control purpose. Such a relay is required to satisfy conditions, such as high reliability, long lifespan, high sensitivity, and the like, and for satisfying such conditions, tests for verifying operation characteristics according to subjects of application are required.

The protection apparatus may realize high reliability of the HVDC system by protecting the AC filter or an inner circuit of a converter transformer bank through verification of relay elements, such as percentage differential, unbalanced current, harmonic overload, overcurrent, ground overcurrent relay elements. Therefore, a test for verifying performances of the AC filter or a protection relay and a protection panel of the converter transformer is essential and an important issue.

SUMMARY

Embodiments provide a protection apparatus and a method of verifying an operation of the protection apparatus capable of simplifying a complicated test procedure for protecting an AC filter or a converter transformer bank in an HVDC system and at the same time enhancing the reliability.

Embodiments also provide a protection apparatus and a method of verifying an operation thereof capable of simplifying a complicated test procedure of the protection apparatus to enhance economic feasibilities, such as time, costs, and the like for the test and increasing easiness of a correction test.

In one embodiment, a method of verifying a protection apparatus includes: setting a plurality of relay elements for sensing an abnormal state of the protection apparatus; receiving an input regarding test information for testing each of the plurality of relay elements; and when at least one of the plurality of relay elements is has an abnormal state according to the reception of the input regarding the test information, identifying whether the protection apparatus generates an abnormal state sensing signal.

According to various embodiments, the complicated test procedure of the protection apparatus may be simplified and at the same time, reliability may be enhanced.

Also, according to various embodiments, the complicated test procedure of the protection apparatus may be simplified to enhance economic feasibilities, such as time, costs, and the like for the test, and easiness of the correction test may be increased.

DETAILED DESCRIPTION OF THE EMBODIMENTS

Hereinafter, detailed description of embodiments related to the present invention will be made with reference to the accompanying drawings. A suffix "module" or "unit" used for constituent elements disclosed in the following description is merely intended for easy description of the specification, and the suffix itself does not give any special meaning or function.

A structure of a protection apparatus according to an embodiment will now be described with reference to FIG. 1.

Figure 1:
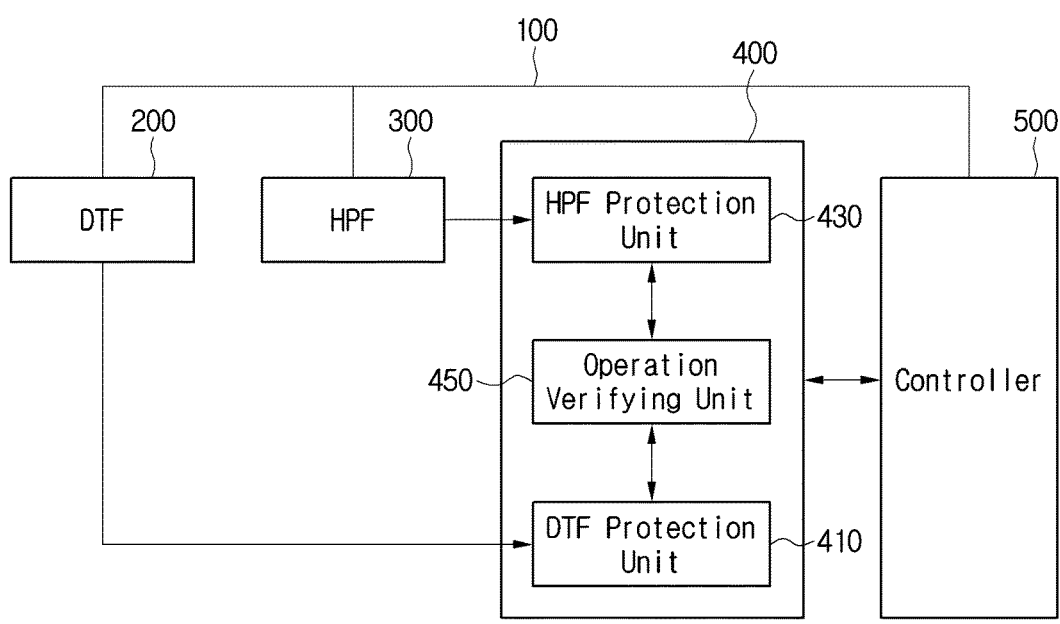
FIG. 1 is a block diagram of a protection apparatus according to an embodiment.

FIG. 1 is a block diagram of a protection apparatus according to an embodiment.

Referring to FIG. 1, a protection apparatus 10 may include an AC bus 100, a double tuned filter (DTF) 200, a high pass filter (HPF) 300, a filter protection unit 400, and a controller 500. Since the elements shown in FIG. 1 may not be essential, the protection apparatus 10 may be implemented to have elements more or less than the elements shown in FIG. 1. In an embodiment, the controller 500 may be included in the filter protection unit 400.

Hereinafter, the above-described elements will be sequentially reviewed.

The AC bus 100 may transmit AC power supplied from an AC power source to the double tuned filter 200 or high pass filter 300.

The double tuned filter (DTF) 200 is a filter having band characteristics tuned to two frequencies in a signal of the AC power supplied from the AC bus 100.

The high pass filter (HPF) 300 is a filter that passes through only a signal having a signal having a frequency higher than a specific frequency in the signal of the received AC power.

The filter protection unit 400 may generate an abnormal state sensing signal through information regarding current supplied from the double tuned filter 2000 and the high pass filter 300. The filter protection unit 400 may include a double tuned filter protection unit 410, a high pass filter protection unit 430, and an operation verifying unit 450. In particular, the double tuned filter protection unit 410 may generate an abnormal state sensing signal through information on current supplied from the double tuned filter 200. The high pass filter protection unit 430 may generate an abnormal state sensing signal through information regarding current supplied from the high pass filter 300.

In an embodiment, the abnormal state sensing signal may be a signal notifying occurrence of an abnormal state when any one of the elements constituting the protection apparatus 10 is in an abnormal state. The abnormal state sensing signal may include a trip signal and an alarm signal. The trip signal may be an interrupt signal for interrupting operations of elements constituting the protection apparatus 10 when any of the elements constituting the protection apparatus 10 is in an abnormal state. The alarm signal may be a signal for alarming occurrence of an abnormal state when any of the elements constituting the protection apparatus 10 is in an abnormal state.

The operation verifying unit 450 may identify an inner line connection state of the protection apparatus 10 and also identify whether any of the elements constituting the protection apparatus 10 is in an abnormal state by setting a plurality of relay elements. Further, the operation verifying unit 450 may identify whether or not the filter protection unit 400 correctly generates an abnormal state sensing signal according to whether or not an abnormal state occurs. Detailed description of the operation verifying unit 450 will be made later.

The controller 500 may control overall operations of the protection apparatus 10. Detailed operations of the controller 500 will be described later.

Next, a configuration of the protection apparatus according to an embodiment will be described with reference to FIGS. 2 to 4.

Figure 2:
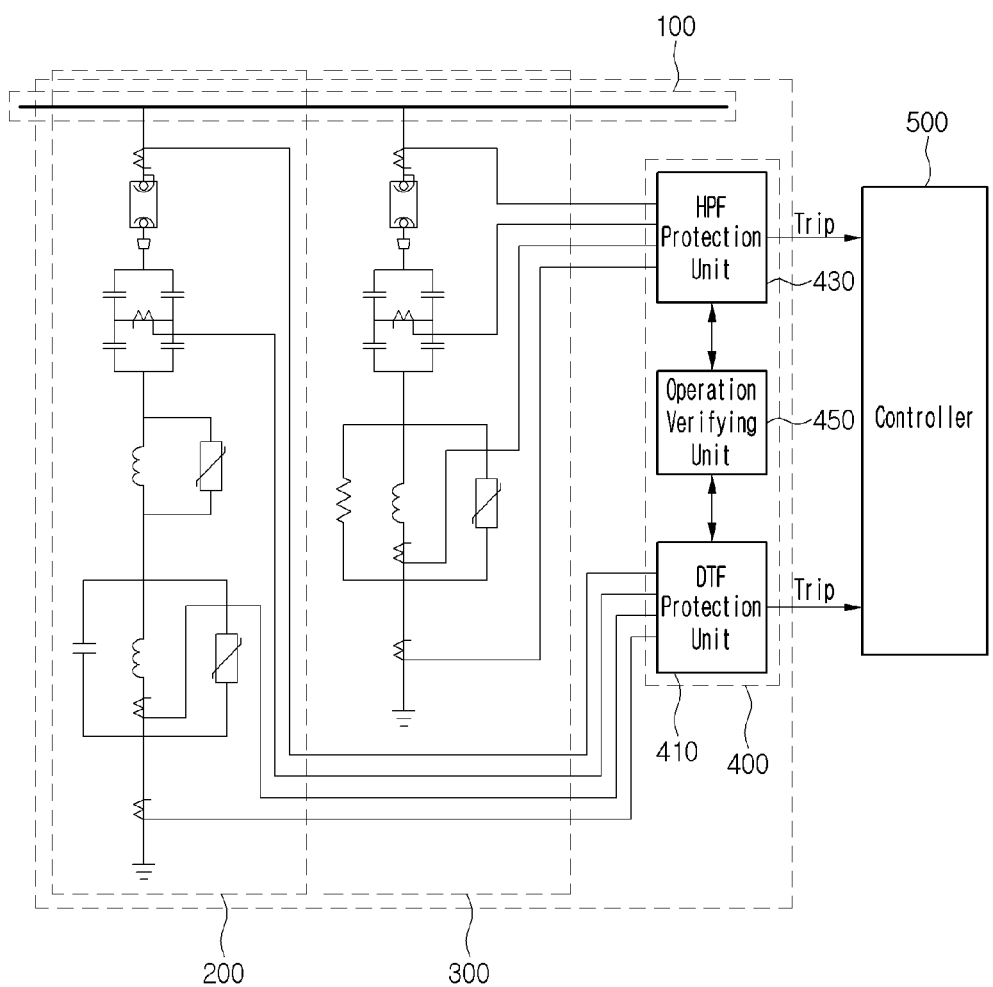
FIG. 2 is a circuit diagram of a protection apparatus according to an embodiment.
Figure 3:
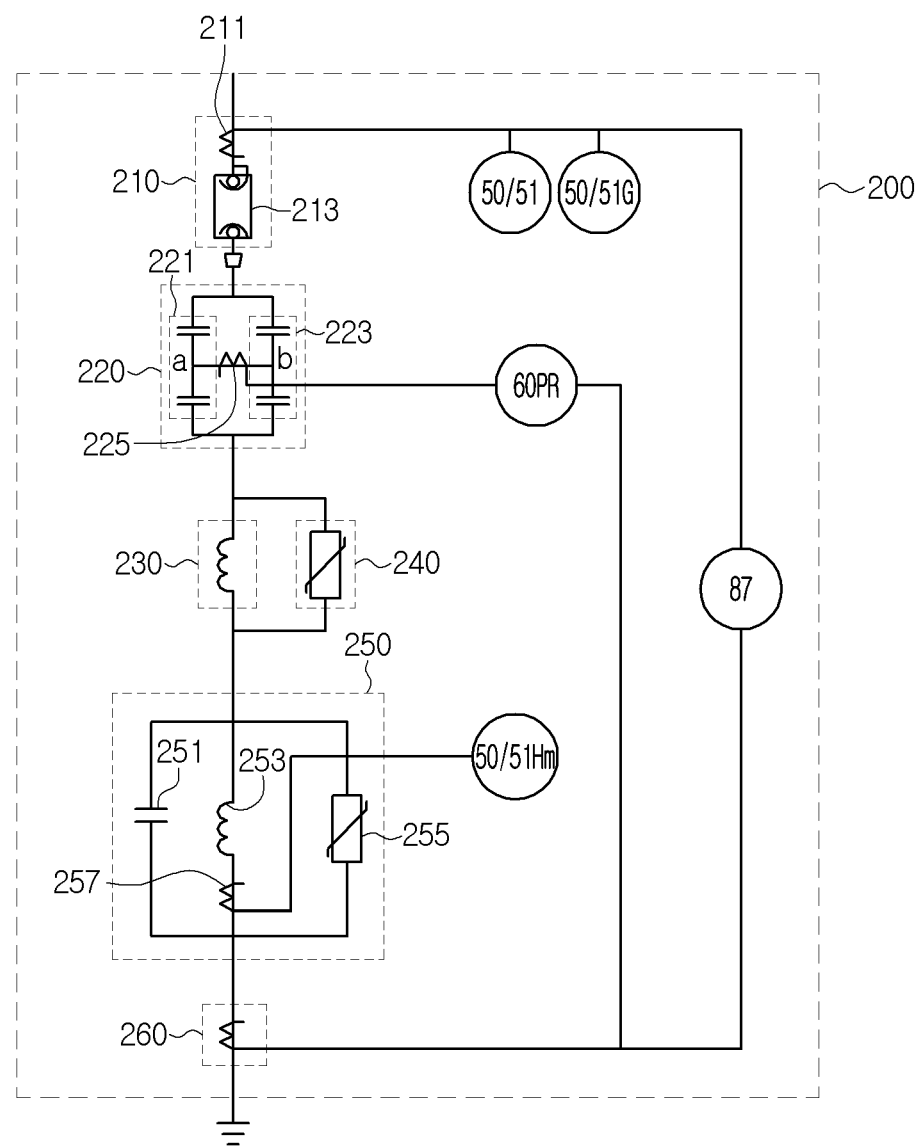
FIG. 3 is a circuit diagram of a double-tuned filter according to an embodiment.
Figure 4:
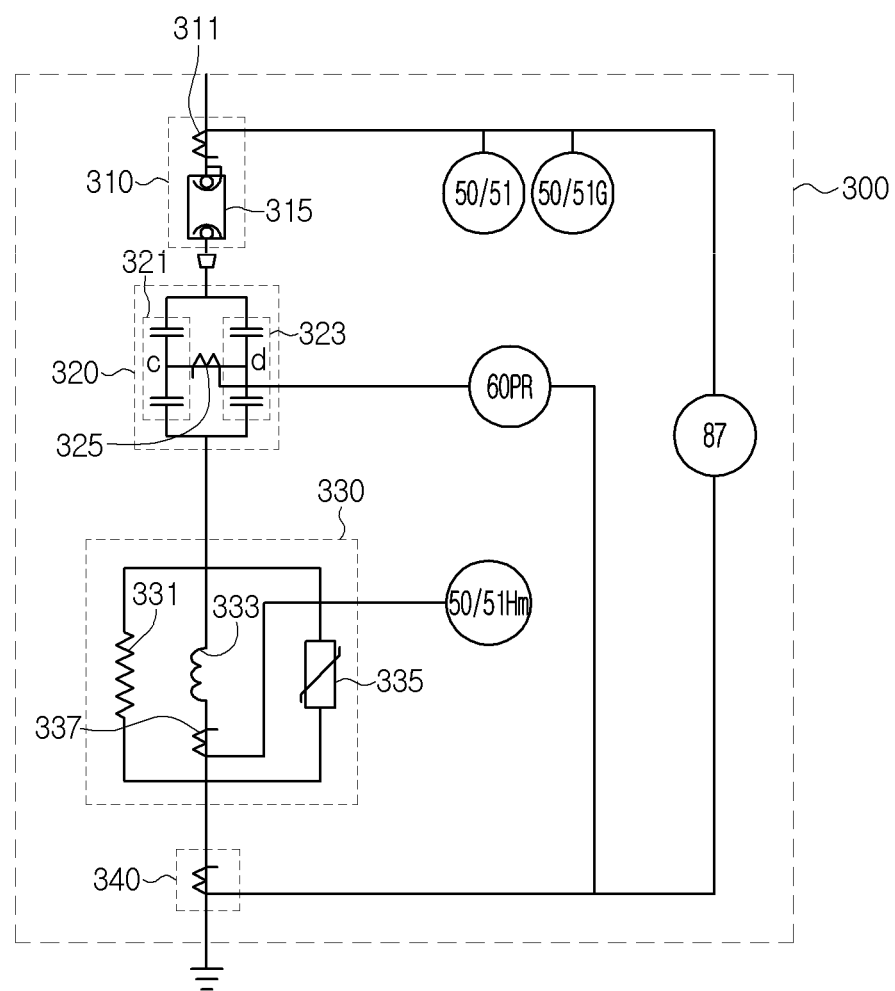
FIG. 4 is a circuit diagram of a high pass filter according to an embodiment.

FIG. 2 is a circuit diagram of a protection apparatus according to an embodiment, FIG. 3 is a circuit diagram of a double-tuned filter according to an embodiment, and FIG. 4 is a circuit diagram of a high pass filter according to an embodiment.

Referring to FIG. 2, the protection apparatus 10 may include the AC bus 100, the double tuned filter 200, the high pass filter 300, and the filter protection unit 400 as described with reference to FIG. 1.

The double tuned filter 200 and the high pass filter 300 may be connected to each other by the AC bus 100. In detail, the AC bus 100 may connect an input terminal of the double tuned filter 200 and an input terminal of the high pass filter 300 to each other, and may transmit AC power supplied from the AC power source to the double tuned filter 200 and the high pass filter 300.

The double tuned filter 200 may be connected to the double tuned filter protection unit 410 of the filter protection unit 400, and the high pass filter 300 may be connected to the high pass filter protection unit 430 of the filter protection unit 400. The double tuned filter protection unit 410 may generate an abnormal state sensing signal through information regarding current supplied from the double tuned filter 200.

Next, a configuration of the double tuned filter 200 will be described in detail with reference to FIG. 3.

Referring to FIG. 3, the double tuned filter 200 may include a circuit breaker 210, a capacitor bank 220, a reactor 230, an arrester 240, a reactor current transformer 250, and a ground current transformer 260.

The circuit breaker 210 may include an overcurrent measuring unit 211 and a gas insulated switchgear (GIS) 213. The circuit breaker 210 may allow transmission current supplied through the AC bus 100 to flow or be interrupted.

The overcurrent measuring unit 211 may measure current inputted into the double tuned filter 200 from the AC bus 100 in order to identify whether the current inputted into the double tuned filter 200 from the AC bus 100 corresponds to an overcurrent or a ground overcurrent. In an embodiment, the overcurrent measuring unit 211 may be a current transformer (CT).

The overcurrent measuring unit 211 may convert an overcurrent to a current which is in proportional to a level of the current inputted to the double tuned filter 200 from the AC bus 100 and has a low level. The current transformer CT used as the overcurrent measuring unit 211 is a device extending the range of current measurement, and may convert a high current flowing through a circuit to a required low current value and then measure the converted current.

The overcurrent measuring unit 211 may transmit information regarding the measured current to the double tuned filter protection unit 410 of the filter protection unit 400. The double tuned filter protection unit 410 may generate an abnormal state sensing signal activating or inactivating the gas insulated switchgear 213 through the current measured by the overcurrent measuring unit 211. In detail, when the current measured by the overcurrent measuring unit 211 corresponds to an overcurrent exceeding a preset current value, the double tuned filter protection unit 410 may generate an abnormal state sensing signal and transmit the generated abnormal state sensing signal to the controller 500. The controller 500 may identify that the overcurrent is inputted into the double tuned filter 200 through the received abnormal state sensing signal and activate the gas insulated switchgear 213, and the activated gas insulated switchgear 213 may interrupt the current flowing through the AC bus 100. Meanwhile, when the current measured by the overcurrent measuring unit 211 does not exceed a preset current value, the double tuned filter protection unit 410 may not generate the abnormal state sensing signal, and the controller 500 may inactivate the gas insulated switchgear 213 to allow the current to be continuously inputted to the double tuned filter 200 from the AC bus 100.

When the current measured by using the current measured by the overcurrent measuring unit 211 corresponds to an overcurrent or a ground overcurrent, the gas insulated switchgear 213 may be activated to interrupt the current inputted into the double tuned filter 200 from the AC bus 100.

The capacitor bank 220, the reactor 230, the arrester 240, and the reactor transformer 250 may play a role in removing a harmonic wave component of AC current flowing through the AC bus 100.

The capacitor bank 220 may identify whether an output current of the current breaker 210 is unbalanced or not. The capacitor bank 220 may include a first capacitor bank 221, a second capacitor bank 223, and an unbalanced current measuring unit 225. Each of the first capacitor bank 221 and the second capacitor bank 223 may include a plurality of capacitive elements. The capacitive element may be a capacitor. The unbalanced current measuring unit 225 may measure a current at point 'a' of the first capacitor bank 221 and a current at point 'b' and transmit information regarding each of the measured currents to the double tuned filter protection unit 410. The double tuned filter protection unit 410 may identify whether or not there is an unbalance between the current at point 'a' and the current at point 'b' through the information transmitted from the unbalanced current measuring unit 225, and may generate an abnormal state sensing signal. In detail, when it is identified that there occurs an unbalance between the current at point 'a' and the current at point 'b', the double tuned filter protection unit 410 may generate an abnormal state sensing signal and transmit the generated abnormal state sensing signal to the controller 500, and the controller may identify that an unbalanced current flows to the capacitor bank 220 through the received abnormal state sensing signal and perform a control such that a balanced current flows to the first capacitor bank 221 and the second capacitor bank 223.

The reactor 230 may remove a harmonic wave component from the output current of the capacitor bank 220. The reactor 230 may include one inductor.

The arrester 240 may prevent an instantaneous overvoltage or impulse voltage from being applied to the reactor 230. In the case an instantaneous overvoltage or impulse voltage is applied to the reactor 230, the arrester 240 may remove the instantaneous overvoltage or impulse voltage to protect the reactor 230.

The reactor current transformer 250 may remove a harmonic wave component from an AC output current of the reactor 230.

The reactor current transformer 250 may include a capacitive passive element 251, an inductive passive element 253, an arrester 255, and a harmonic overcurrent measuring unit 257. The capacitive passive element 251 may be a capacitor and the inductive passive element 253 may include an inductor. The arrester 255 may prevent an instantaneous overvoltage or impulse voltage from being applied to the inductive element 253. The harmonic overcurrent measuring unit 257 may transmit information regarding an output current of the inductive element 253 to the double tuned filter protection unit 410 of the filter protection unit 400 in order to remove a harmonic component from the output current of the inductive element 253. The double tuned filter protection unit 410 may identify whether or not the reactor current transformer 250 correctly removes a harmonic component through the information supplied from the harmonic overcurrent measuring unit 257, and may generate an abnormal state sensing signal according to the identified states. In detail, when it is identified that the reactor current transformer 250 does not correctly remove a harmonic component, the double tuned filter protection unit 410 may generate an abnormal state sensing signal and transmit the generated abnormal state sensing signal to the controller 500. The controller 500 may identify that a harmonic component is correctly removed from the output current of the reactor current transformer 250 through the received abnormal state sensing signal and may control the double tuned filter 200 such that the harmonic component is removed from the output current of the reactor current transformer 250.

The ground current transformer 260 may measure an output current of the double tuned filter 200. The overcurrent measuring unit 211 may transmit information regarding current inputted from the AC bus 100 into the double tuned filter 200 to the double tuned filter protection unit 410, and the ground current transformer 260 may measure the output current of the double tuned filter 200 and transmit information regarding the measured current to the double tuned filter protection unit 410. The double tuned filter protection unit 410 may compare the input current of the double tuned filter 200 with the output current of the double tuned filter 200 by using the information regarding the current supplied from the overcurrent measuring unit 211 and the ground current transformer 260. The double tuned filter protection unit 410 may compare the input current of the double tuned filter 200 with the output current of the double tuned filter 200 to identify that a difference between the input current and the output current of the double tuned filter 200 is within a preset difference. When the difference exceeds the preset difference, the double tuned filter protection unit 410 may generate an abnormal state sensing signal and transmit the generated abnormal state sensing signal to the controller 500. In an embodiment, the present difference may differ according to a user's setup.

Next, a configuration of the high pass filter 300 will be described with reference to FIG. 4.

Referring to FIG. 4, the high pass filter 300 may include a current breaker 310, a capacitor bank 320, a reactor current transformer 330, and a ground current transformer 340.

The circuit breaker 310 may include an overcurrent measuring unit 311 and a gas insulated switchgear (GIS) 313. The circuit breaker 310 may allow transmission current inputted from the AC bus 100 to flow or be interrupted.

The overcurrent measuring unit 311 may measure a current inputted to the high pass filter 300 from the AC bus 100 in order to identify whether the current inputted to the high pass filter 300 from the AC bus 100 corresponds to an overcurrent or a ground overcurrent. In an embodiment, the overcurrent measuring unit 311 may be a current transformer (CT).

The overcurrent measuring unit 311 may convert an overcurrent to a current which is in proportional to a level of the current inputted into the high pass filter 300 from the AC bus 100 and has a low level. The current transformer CT used as the overcurrent measuring unit 311 is a device extending the range of current measurement, and may convert a high current flowing through a circuit to a required low current value and then measure the converted current.

The overcurrent measuring unit 311 may transmit information regarding the measured current to the high pass filter protection unit 430 of the filter protection unit 400. The high pass filter protection unit 430 may generate an abnormal state sensing signal activating or inactivating the gas insulated switchgear 311 through the current measured by the overcurrent measuring unit 313. In detail, when the current measured by the overcurrent measuring unit 311 corresponds to an overcurrent exceeding a preset current value, the high pass filter protection unit 430 may generate an abnormal state sensing signal and transmit the generated abnormal state sensing signal to the controller 500. The controller 500 may identify that the overcurrent is inputted into the high pass filter 300 through the received abnormal state sensing signal and activate the gas insulated switchgear 313, and the activated gas insulated switchgear 313 may interrupt the current flowing through the AC bus 100. Meanwhile, when the current measured by the overcurrent measuring unit 311 does not exceed a preset current value, the high pass filter protection unit 430 may not generate the abnormal state sensing signal, and the controller 500 may inactivate the gas insulated switchgear 313 to allow the current to be continuously inputted into the high pass filter 300 from the AC bus 100.

When the current measured by using the current measured by the overcurrent measuring unit 313 corresponds to an overcurrent or a ground overcurrent, the gas insulated switchgear 311 may be activated to interrupt the current flowing into the high pass filter 300 from the AC bus 100.

The capacitor bank 320, the reactor current transformer 330, and the ground current transformer 340 may play a role in removing a harmonic wave component of AC current inputted from the AC bus 100.

The capacitor bank 320 may identify whether an output current of the current breaker 310 is unbalanced or not. The capacitor bank 320 may include a first capacitor bank 321, a second capacitor bank 323, and an unbalanced current measuring unit 325. Each of the first capacitor bank 321 and the second capacitor bank 323 may include a plurality of capacitive devices. The capacitive element may be a capacitor. The unbalanced current measuring unit 325 may measure a current at point 'c' of the first capacitor bank 321 and a current at point 'd' and transmit information regarding each of the measured currents to the high pass filter protection unit 430. The high pass tuned filter protection unit 430 may identify whether or not there is an unbalance between the current at point 'c' and the current at point 'd' through the information transmitted from the unbalanced current measuring unit 325, and may generate an abnormal state sensing signal. In detail, when it is identified that there occurs an unbalance between the current at point 'c' and the current at point 'd', the high pass filter protection unit 430 may generate an abnormal state sensing signal and transmit the generated abnormal state sensing signal to the controller 500, and the controller may identify that an unbalanced current flows to the capacitor bank 320 through the received abnormal state sensing signal and perform a control such that a balanced current flows into the first capacitor bank 321 and the second capacitor bank 323.

The reactor current transformer 330 may remove a harmonic wave component from an AC output current of the capacitor bank 320.

The reactor current transformer 330 may include a passive element 331, an inductive passive element 333, an arrester 335, and a harmonic overcurrent measuring unit 337. The passive element 331 may be a resistor and the inductive passive element 333 may include an inductor. The arrester 335 may prevent an instantaneous overvoltage or impulse voltage from being applied to the inductive element 333. The harmonic overcurrent measuring unit 337 may transmit information regarding an output current of the inductive element 333 to the high pass filter protection unit 430 of the filter protection unit 400 in order to remove a harmonic component from the output current of the inductive element 333. The high pass filter protection unit 430 may identify whether or not the reactor current transformer 330 correctly removes a harmonic component through the information supplied from the harmonic overcurrent measuring unit 337, and may generate an abnormal state sensing signal according to the identified states. In detail, when it is identified that the reactor current transformer 330 does not correctly remove a harmonic component, the high pass filter protection unit 430 may generate an abnormal state sensing signal and transmit the generated abnormal state sensing signal to the controller 500. The controller 500 may identify that a harmonic component is correctly removed from the output current of the reactor current transformer 330 through the received abnormal state sensing signal and may control the high pass filter 300 such that the harmonic component is removed from the output current of the reactor current transformer 330.

The ground current transformer 340 may measure an output current of the high pass filter 300. The overcurrent measuring unit 311 may transmit information regarding the current inputted from the AC bus 100 into the high pass filter 300 to the high pass filter protection unit 430, and the ground current transformer 340 may measure the output current of the high pass filter 300 and transmit information regarding the measured current to the high pass filter protection unit 410. The high pass filter protection unit 410 may compare the input current of the high pass filter 300 with the output current of the high pass filter 300 by using the information regarding the current supplied from the overcurrent measuring unit 311 and the ground current transformer 340. The high pass filter protection unit 430 may compare the input current of the high pass filter 200 with the output current of the high pass filter 300 to identify that a difference between the input current and the output current of the high pass filter 300 is within a preset difference. When the difference exceeds the preset difference, the high pass filter protection unit 430 may generate an abnormal state sensing signal and transmit the generated abnormal state sensing signal to the controller 500. In an embodiment, the present difference may differ according to a user's setup.

Next, a protection apparatus and a method of verifying an operation thereof according to another embodiment will be described with reference to FIGS. 5 to 7.

Figure 5:
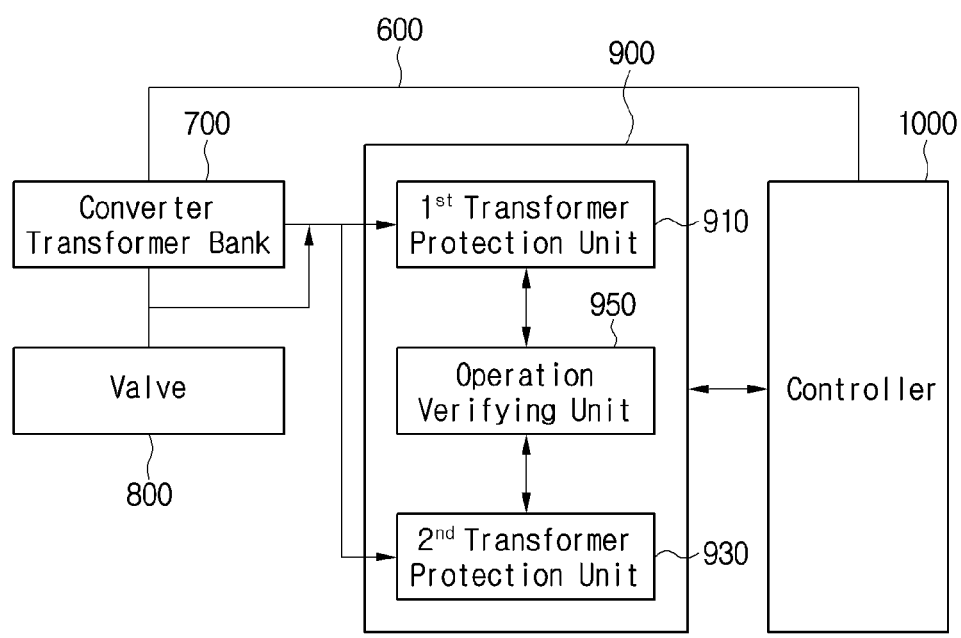
FIG. 5 is a block diagram of a protection apparatus according to another embodiment.
Figure 6:
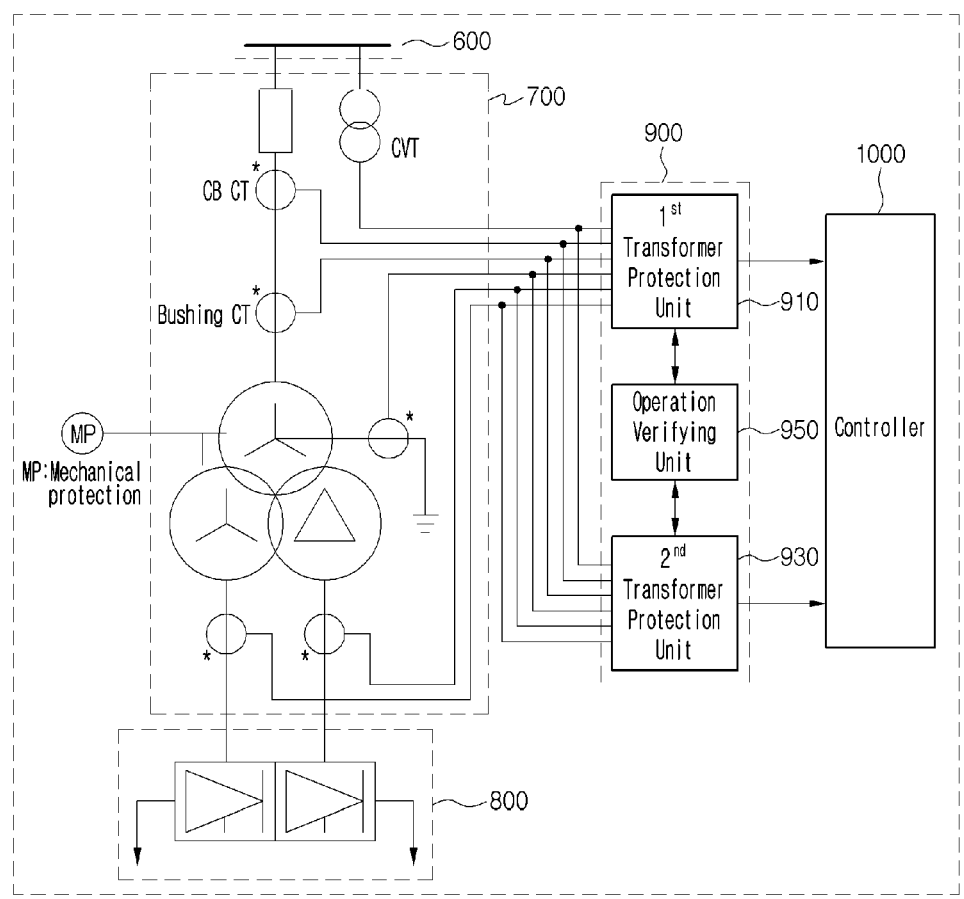
FIG. 6 is a block diagram of a protection apparatus according to still another embodiment.
Figure 7:
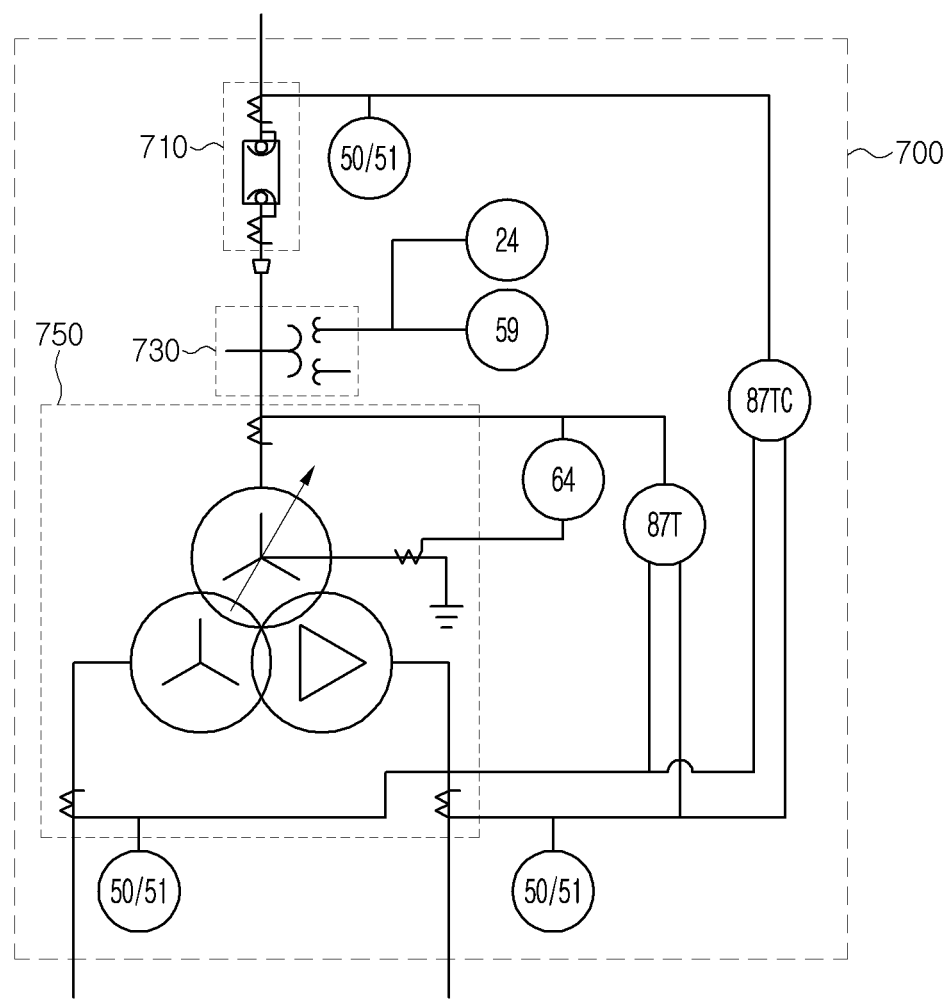
FIG. 7 is a circuit diagram of converter transformer included in a protection apparatus according to yet another embodiment.

FIG. 5 is a block diagram of a protection apparatus according to another embodiment, FIG. 6 is a block diagram of a protection apparatus according to still another embodiment, and FIG. 7 is a circuit diagram of converter transformer included in a protection apparatus according to yet another embodiment First, referring to FIG. 5, a protection apparatus 20 according to another embodiment may include an AC bus 600, a converter transformer (CT) bank 700, a valve 800, a transformer protection unit 900, and a controller 1000. Since the elements shown in FIG. 5 may not be essential, the protection apparatus 20 may be implemented to have elements more or less than the elements shown in FIG. 5. In an embodiment, the controller 1000 may be included in the transformer protection unit 900.

Hereinafter, the above-described elements will be sequentially reviewed.

The AC bus 600 may transmit an AC power supplied from an AC power source to the CT bank 700.

The CT bank 700 may be connected to the AC bus 600 and the valve 800.

The valve 800 may convert an AC power to a DC power and vice versa. That is, the valve 800 is a power electronic element to convert an AC voltage to a DC voltage and vice versa.

The transformer protection unit 900 may generate an abnormal state sensing signal through information regarding current supplied from the CT bank 700. In an embodiment, the abnormal state sensing signal may be a signal notifying occurrence of an abnormal state when any one of the elements constituting the protection apparatus 20 is in an abnormal state. The abnormal state sensing signal may include a trip signal and an alarm signal. The trip signal may be an interrupt signal for interrupting an operation of an element of the protection apparatus 20 when the element of the protection apparatus 20 is in an abnormal state. The alarm signal may be a signal for alarming occurrence of an abnormal state when an element of the protection apparatus 20 is in an abnormal state.

The transformer protection unit 900 may include a first transformer protection unit 910, a second transformer protection unit 930, and an operation verifying unit 950.

The first transformer protection unit 910 may generate an abnormal state sensing signal through information regarding current supplied from the CT bank 700 in a normal environment.

The second transformer protection unit 930 may operate when the first transformer protection unit 910 has a problem, and may perform the same role as the first transformer protection unit 910.

The operation verifying unit 950 may identify an inner line connection state of the protection apparatus 20 and also identify whether an abnormal state occurs by setting a plurality of relay elements. Further, the operation verification unit 950 may identify whether or not the transformer protection unit 900 correctly generates an abnormal state sensing signal according to whether or not an abnormal state occurs.

The controller 1000 may control overall operations of the protection apparatus 20.

Next, a configuration of a protection apparatus 20 according to another embodiment will be described with reference to FIG. 6.

Referring to FIG. 6, the protection apparatus 20 may include an AC bus 600, a converter transformer (CT) bank 700, a valve 800, a transformer protection unit 900, and a controller 1000 as described with reference to FIG. 5.

The CT bank 700 may be connected to the AC bus 600 to receive an AC power from the AC bus 600, and be connected to the valve 800.

An input or output of each of elements constituting the CT bank 700 may be connected to the transformer protection unit 900.

The transformer protection unit 900 may generate an abnormal state sensing signal by using information regarding current delivered from the CT bank 700.

Next, a configuration of the CT bank 700 will be described in detail with reference to FIG. 7.

Referring to FIG. 7, the CT bank 700 may include a circuit breaker 710, a bus voltage measuring unit 730, and a converter transformer 750.

The circuit breaker 710 may include an overcurrent measuring unit 711 and a gas insulated switchgear (GIS) 713. The circuit breaker 710 may allow transmission current inputted from the AC bus 100 to flow or be interrupted.

The bus voltage measuring unit 730 may measure a bus voltage which is outputted from the circuit breaker 710 and is supplied through the AC bus 600. In an embodiment, the bus voltage measuring unit 730 may include a potential transformer (PT). The bus voltage measuring unit 730 may be a configuration for identifying an overvoltage relay element and an overexcitation current relay element. The overvoltage relay element may be a relay element for identifying whether or not a voltage applied to the converter transformer 750 exceeds a preset voltage, and the overexcitation current relay element may be a relay element for identifying an inrush current generated when a voltage is applied in a state that a voltage is not applied to the converter transformer 750.

The converter transformer 750 may convert an AC voltage inputted through a three phase power source to an AC voltage having a predetermined level.

The converter transformer 750 may include a current transformer connected to each of two Y power sources and one delta power source constituting the three phase power source.

Next, a method of verifying an operation of the protection apparatus will be described with reference to FIG. 8.

Figure 8:
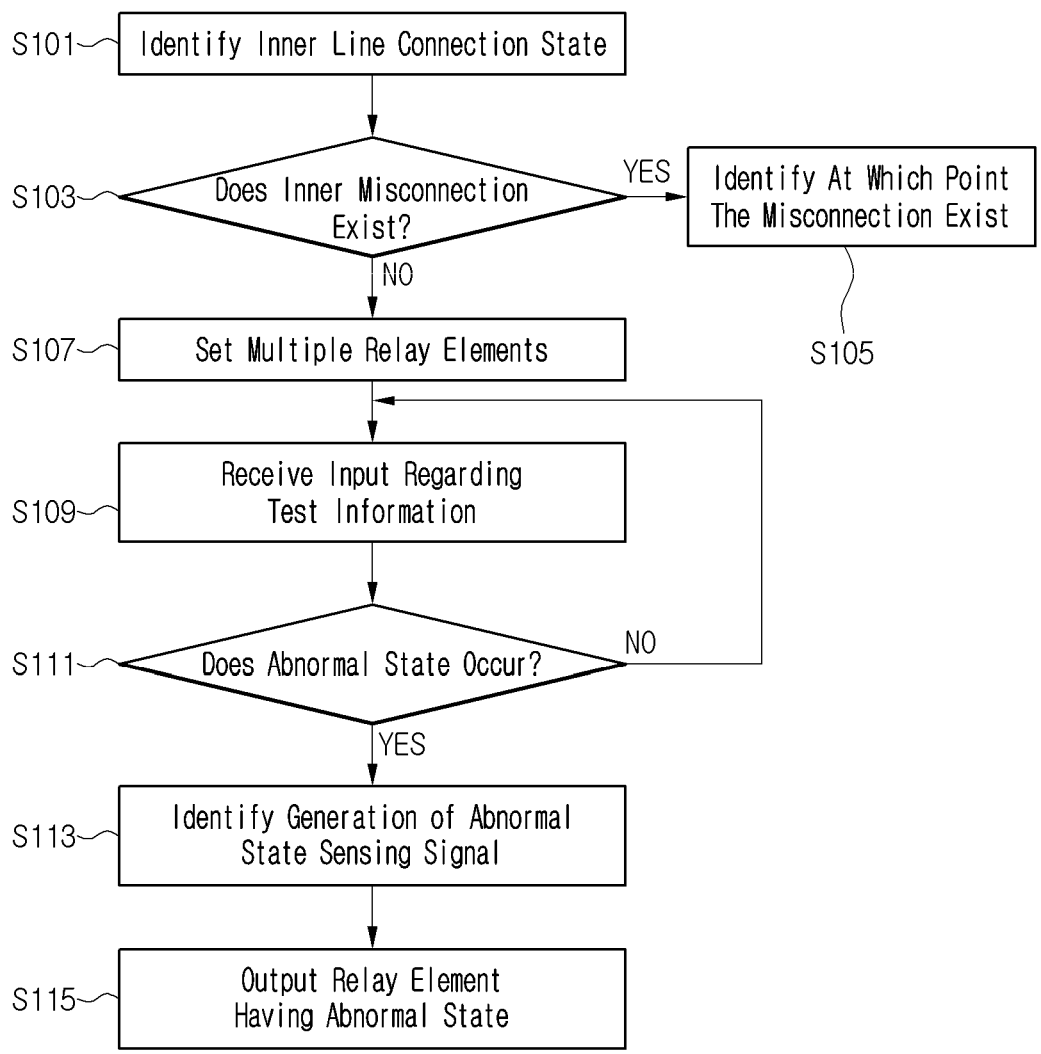
FIG. 8 is a flow diagram for explaining a method for verifying an operation of a protection apparatus according to an embodiment.

FIG. 8 is a flow diagram for explaining a method for controlling distributed generators according to an embodiment. The descriptions regarding FIGS. 1 to 7 will be considered for describing the embodiment of FIG. 8. While respective operations in the following embodiment will be described with an example of the protection apparatus 10 according to an embodiment, these respective operations may be also applied to the protection apparatus 20 according to another embodiment. Therefore, description thereof will be described at the end of each operation.

Referring to FIG. 8, the operation verifying unit 450 of the filter protection unit 400 identifies a line connection state of an inner circuit of the protection apparatus 10 (S101). The filter protection unit 400 may separately store information in advance on the line connection state in which the double tuned filter 200, the high pass filter 300 and the filter protection unit 400 are connected, and the operation verifying unit 450 may identify the line connection state of the protection apparatus 10 through a current outputted from the high pass filter 300 when a test current having a predetermined level is inputted into the AC bus 100. In detail, in the case the output currents of the double tuned filter 200 and the high pass filter 300 with respect to the input current having the predetermined level are all zero (0), the operation verifying unit 450 may identify that there no exist misconnection in the protection apparatus 10, and in the case the output currents are not zero (0), the operation verifying unit 450 may identify that there exists a misconnection in the protection apparatus 10.

In another embodiment, the operation verifying unit 450 may identify at which point a misconnection occurs through a current measured by the current transformer included in each of the double tuned filter 200 and the high pass filter 300.

When description is made by applying operation S101 to FIGS. 5 to 7, the operation verifying unit 950 of the transformer protection unit 900 identifies a line connection state of the inner circuit of the protection apparatus 20 (S101). The transformer protection unit 900 may separately store in advance information regarding the line connection state in which the CT bank 700 and the valve 800 are connected, and the operation verifying unit 950 may identify the line connection state of the protection apparatus 20 through a current outputted from the CT bank 700 and the valve 800 when a current having a predetermined level is inputted into the AC bus 100. In detail, in the case the output currents of the CT bank 700 and the valve 800 with respect to the input current having the predetermined level are all zero (0), the operation verifying unit 950 may identify that there no exist misconnection in the protection apparatus 20, and in the case the output currents are not zero (0), the operation verifying unit 950 may identify that there exists a misconnection in the protection apparatus 20.

In another embodiment, the operation verifying unit 450 may identify at which point a connection is made through a current measured by the current transformer included in each of the double tuned filter 200 and the high pass filter 300.

In the case it is identified that an inner connection is made in the protection apparatus 10 (S103), the operation verifying unit 450 identifies at which point a connection is made (S105). Meanwhile, when description is made by applying operations S103 and S105 to FIGS. 5 to 7, in case it is identified an inner connection exists in the protection apparatus (S103), the operation verifying unit 950 identifies at which point of the protection apparatus 20 a connection is made (S105).

When it is identified that an inner connection is made in the protection apparatus 10 (S103), the operation verifying unit 450 sets each of the plurality of relay elements in order to sense an abnormal state of the protection apparatus (S107). In an embodiment, the plurality of relay elements may include an overcurrent relay element, a ground overcurrent relay element, an unbalanced current relay element, a harmonic overcurrent relay element, and a percentage differential relay element.

The overcurrent relay element may be a relay element to determine whether or not the current inputted from the AC bus 100 into the double tuned filter 200 or the high pass filter 300 exceeds a preset current. The operation verifying unit 450 may set the preset value in order to identify whether the current inputted into the double tuned filter 200 or the high pass filter 300 is an overcurrent.

The ground overcurrent relay element may be a relay element to determine whether or not the current inputted from the AC bus 100 into the double tuned filter 200 or the high pass filter 300 exceeds a preset ground current. The operation verifying unit 450 may set the preset ground current value in order to identify whether the current inputted into the double tuned filter 200 or the high pass filter 300 is a ground overcurrent.

The unbalanced current relay element may be a relay element to identify whether a current measured by the capacitor bank 220 of the double tuned filter 200 or the capacitor bank 320 of the high pass filter 300 has an unbalanced state.

The harmonic overcurrent relay element may be a relay element to identify whether a harmonic component is removed from an AC current outputted from the reactor current transformer 250 of the double tuned filter 200 or the reactor current transformer 330 of the high pass filter 300.

The percentage differential relay element may be a relay element to identify whether a difference between input and output currents of the double tuned filter 200 and a difference between input and output currents of the high pass filter 300 exceed preset differences.

Meanwhile, description will be made by applying operation S107 to FIGS. 5 to 7. When it is identified that an inner connection is not made in the protection apparatus 20 (S103), the operation verifying unit 950 sets each of the plurality of relay elements in order to sense an abnormal state of the protection apparatus (S107). In an embodiment, the plurality of relay elements may include an overcurrent relay element, a ground overcurrent relay element, an overvoltage relay element, an overexcitation current relay element, and a percentage differential relay element.

The overcurrent relay element may be a relay element to determine whether or not the current inputted from the AC bus 600 into the CT bank 700 exceeds a preset current. The operation verifying unit 950 may set a preset value in order to identify whether the current inputted into the CT bank 700 is an overcurrent.

The ground overcurrent relay element may be a relay element to determine whether or not the current inputted from the AC bus 600 into the CT bank 700 exceeds a preset ground current. The operation verifying unit 950 may set a preset ground current value in order to identify whether the current inputted into the CT bank 700 is a ground overcurrent.

The percentage differential relay element may be a relay element to identify whether a difference between input and output currents of the CT bank 700 exceeds a preset difference.

The operation verifying unit 450 receives an input regarding test information for testing each of the set plurality of relay elements (S109). In an embodiment, the test information may be information inputted into the double tuned filter 200 and the high pass filter 300 in order to identify whether any one of the plurality of relay elements has a problem. For example, it is assumed to test the percentage differential relay element of the double tuned filter 200. In this case, the test information may be a micro current inputted into the double tuned filter 200, and the operation verifying unit 450 may compare the level of the micro current inputted into the double tuned filter 200 and the level of a current outputted from the double tuned filter 200 to identify whether the difference exceeds a preset difference.

Meanwhile, description will be made by applying operation S109 to FIGS. 5 to 7.

The operation verifying unit 950 receives an input regarding test information for testing each of the set plurality of relay elements (S109). In an embodiment, the test information may be information inputted into the CT bank 700 in order to identify whether any one of the plurality of relay elements has a problem. For example, it is assumed to test the percentage differential relay element of the CT bank 700. In this case, the test information may be a micro current inputted into the CT bank 700, and the operation verifying unit 950 may compare the level of the micro current inputted into the CT bank 700 and the level of a current outputted from the CT bank 700 to identify whether the difference exceeds a preset difference.

Then, the operation verifying unit 450 identifies whether an abnormal state is generated in any of the plurality of relay elements according to the input test information (S111). For example, when the percentage differential relay element of the double tuned filter 200 is tested, when the level of a micro current inputted into the double tuned filter 200 with the level of a current outputted from the double tuned filter 200 are compared and a difference therebetween exceeds a preset difference, the operation verifying unit 450 may identify that an abnormal state is generated. When the level of the micro current inputted into the double tuned filter 200 and the level of the micro current outputted from the double tuned filter 200 are compared and a difference therebetween does not exceed a preset difference, the operation verifying unit 450 may identify that an abnormal state is not generated.

Meanwhile, description will be made by applying operation S111 to FIGS. 5 to 7.

Then, the operation verifying unit 950 identifies whether an abnormal state is generated in any of the plurality of relay elements according to the input test information (S111). For example, when the percentage differential relay element of the CT bank 700 is tested, when the level of a micro current inputted into the CT bank 700 and the level of a current outputted from the CT bank 700 are compared and a difference therebetween exceeds a preset difference, the operation verifying unit 950 may identify that an abnormal state is generated. When the level of the micro current inputted into the CT bank 700 and the level of the micro current outputted from the CT bank 700 are compared and a difference therebetween does not exceed a preset difference, the operation verifying unit 950 may identify that an abnormal state is not generated.

When it is identified that an abnormal state is generated in any one of the plurality of relay elements, the operation verifying unit 450 identifies whether the filter protection unit 400 generates an abnormal state sensing signal (S113). For example, when the percentage differential relay element of the double tuned filter 200 is tested, when the level of a micro current inputted into the double tuned filter 200 and the level of a current outputted from the double tuned filter 200 are compared and a difference therebetween exceeds a preset difference, it may be identified whether the double tuned filter protection unit 410 correctly generates an abnormal state sensing signal.

Meanwhile, description will be made by applying operation S113 to FIGS. 5 to 7.

When it is identified that an abnormal state is generated in any one of the plurality of relay elements, the operation verifying unit 950 identifies whether the transformer protection unit 900 correctly generates an abnormal state sensing signal (S113). For example, when the percentage differential relay element of the CT bank 700 is tested, when the level of a micro current inputted into the CT bank 700 and the level of a current outputted from the CT bank 700 are compared and a difference therebetween exceeds a preset difference, the operation verifying unit 450 may identify whether the transformer protection unit 900 correctly generates an abnormal state sensing signal.

The operation verifying unit 450 outputs a relay element having an abnormal state among the plurality of relay elements on a display unit (not shown) through the generated abnormal state sensing signal (S115).

Meanwhile, when it is identified that an abnormal state is not generated in any one of the plurality of relay elements, the flow returns to operation S109. The test information input operation S109 may be periodically performed.

Meanwhile, description will be made by applying operation S113 to FIGS. 5 to 7.

The operation verifying unit 950 outputs a relay element having an abnormal state among the plurality of relay elements on a display unit (not shown) through the generated abnormal state sensing signal (S115).

Meanwhile, when it is identified that an abnormal state is not generated in any one of the plurality of relay elements, the flow returns to operation S109. The test information input operation S109 may be periodically performed.

According to an embodiment, the foregoing method may be implemented as codes readable by a process on a program-recorded medium. Examples of the processor-readable media may include ROM, RAM, CD-ROM, magnetic tape, floppy disk, and optical data storage device, and the like, and also include a device implemented in the form of a carrier wave (for example, transmission via the Internet).

What is claimed is:

1. A method of verifying a protection apparatus, the method comprising:
    applying a test current to an alternating current (AC) bus to identify a line connection state of an inner circuit of the protection apparatus, the AC bus configured to connect an input terminal of a double tune filter to an input terminal of a high pass filter and transmit AC power supplied from an AC power source to the double tune filter and the high pass filter;
    identifying that there is no misconnection in the inner circuit when all the output currents of the double tuned filter and the high pass filter are zero with respect to the applied test current;
    setting a plurality of relay elements for sensing an abnormal state of the protection apparatus when there is no misconnection;
    receiving an input related to test information for testing each of the plurality of relay elements, the input related to test information including a micro current that is input to the double tuned filter;
    comparing a level of the micro current input to the double tuned filter with a level of a current output from the double tuned filter; and
    identifying that an abnormal state is generated when a difference between the micro current input to the double tuned filter and the level of the current output from the double tuned filter exceeds a preset value,
    wherein the plurality of relay elements comprise an overcurrent relay element, a ground overcurrent relay element, an unbalanced current relay element and a percentage differential relay element.

2. The method according to claim 1, further comprising identifying a point at which a misconnection exists in the inner circuit according to the identified line connection state.

3. The method according to claim 1, wherein the plurality of relay elements further comprise a harmonic overcurrent relay element when the protection apparatus is protecting an AC filter.

4. The method according to claim 1, wherein setting the plurality of relay elements comprises setting a minimum preset value necessary for generation of the abnormal state for each of the plurality of relay elements.

5. A protection apparatus applying a test current to identify a line connection state of an inner circuit of the protection apparatus, the protection apparatus comprising:
    a double tuned filter;
    a high pass filter;
    an alternating current (AC) bus configured to connect an input terminal of the double tune filter to an input terminal of the high pass filter and transmit AC power supplied from an AC power source to the double tune filter and the high pass filter;
    a filter protection unit configured to:
    apply the test current to the AC bus to identify the line connection state,
    identify that there is no misconnection when all the output currents of the double tuned filter and the high pass filter are zero with respect to the applied test current;
    set a plurality of relay elements for sensing an abnormal state of the protection apparatus when there is no misconnection;
    receive an input related to test information for testing each of the plurality of relay elements, the input regarding test information including a micro current that is input to the double tuned filter;
    compare a level of the micro current input to the double tuned filter with a level of a current output from the double tuned filter,
    identify that an abnormal state is generated when a difference between the micro current input to the double tuned filter and the level of the current output from the double tuned filter exceeds a preset value,
    wherein the plurality of relay elements comprise an overcurrent relay element, a ground overcurrent relay element, an unbalanced current relay element and a percentage differential relay element.

6. The protection apparatus according to claim 5, wherein the protection apparatus further identifies a point at which the misconnection exists in the inner circuit according to the identified line connection state.

7. The protection apparatus according to claim 5, wherein the plurality of relay elements further comprise a harmonic overcurrent relay element when the protection apparatus is protecting the AC filter.

8. The protection apparatus according to claim 5, wherein the protection apparatus further sets a minimal preset value necessary for generation of the abnormal state for each of the plurality of relay elements.

* * * * *